United States Patent
Wei et al.

(10) Patent No.: US 9,305,785 B2
(45) Date of Patent: Apr. 5, 2016

(54) SEMICONDUCTOR CONTACTS AND METHODS OF FABRICATION

(71) Applicant: GLOBALFOUNDRIES Inc., Grand Cayman (KY)

(72) Inventors: Andy Chih-Hung Wei, Queensbury, NY (US); Guillaume Bouche, Albany, NY (US); Gabriel Padron Wells, Saratoga Springs, NY (US); Xiang Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 138 days.

(21) Appl. No.: 14/318,901

(22) Filed: Jun. 30, 2014

(65) Prior Publication Data

US 2015/0380250 A1    Dec. 31, 2015

(51) Int. Cl.
| H01L 27/088 | (2006.01) |
| H01L 21/28 | (2006.01) |
| H01L 29/06 | (2006.01) |
| H01L 23/535 | (2006.01) |
| H01L 21/762 | (2006.01) |
| H01L 29/66 | (2006.01) |
| H01L 27/12 | (2006.01) |
| H01L 21/84 | (2006.01) |
| H01L 29/78 | (2006.01) |

(52) U.S. Cl.
CPC .... *H01L 21/28008* (2013.01); *H01L 21/76224* (2013.01); *H01L 21/845* (2013.01); *H01L 23/535* (2013.01); *H01L 27/0886* (2013.01); *H01L 27/1211* (2013.01); *H01L 29/0649* (2013.01); *H01L 29/66795* (2013.01); *H01L 29/785* (2013.01)

(58) Field of Classification Search
CPC ............ H01L 29/66795; H01L 29/785; H01L 27/1211; H01L 21/845
See application file for complete search history.

(56) References Cited

U.S. PATENT DOCUMENTS

| 5,380,680 | A | 1/1995 | Choi | |
| 7,217,623 | B2 * | 5/2007 | Kim | H01L 29/66621 257/E21.429 |
| 7,608,535 | B2 | 10/2009 | Kim | |
| 2014/0246731 | A1 * | 9/2014 | Chen | H01L 21/823481 257/386 |
| 2014/0327080 | A1 * | 11/2014 | Hung | H01L 29/66515 257/365 |
| 2015/0021710 | A1 * | 1/2015 | Hsu | H01L 27/0886 257/401 |
| 2015/0060960 | A1 * | 3/2015 | Xie | H01L 29/785 257/288 |
| 2015/0200252 | A1 * | 7/2015 | Ching | H01L 21/76224 257/510 |
| 2015/0270359 | A1 * | 9/2015 | Basker | H01L 29/0642 438/151 |
| 2015/0279972 | A1 * | 10/2015 | Xie | H01L 29/66795 438/283 |

* cited by examiner

*Primary Examiner* — Bac Au
(74) *Attorney, Agent, or Firm* — Williams Morgan, P.C.

(57) ABSTRACT

Embodiments of the present invention provide an improved structure and method of contact formation. A cap nitride is removed from a gate in a region that is distanced from a fin. This facilitates reduced process steps, allowing the gate and the source/drain regions to be opened in the same process step. Extreme Ultraviolet Lithography (EUVL) may be used to pattern the resist to form the contacts.

20 Claims, 10 Drawing Sheets

SEMICONDUCTOR CONTACTS AND METHODS OF FABRICATION

FIELD OF THE INVENTION

The present invention relates generally to semiconductor fabrication, and more particularly, to semiconductor contacts and methods of fabrication.

BACKGROUND

As technology progresses, the manufacture of electronic devices must be improved to meet the trend of mobile, lightweight, and efficient electronic devices. However, as devices scale, certain processes become quite challenging. These challenges include middle of line (MOL) processes such as forming contacts on gates and source/drain regions of transistors. Currently, there are many time-consuming process steps involved in fabrication of contacts. It is therefore desirable to have improvements in MOL integration to address the aforementioned challenges.

SUMMARY

Embodiments of the present invention provide an improved structure and method of contact formation. A cap nitride is removed from a gate in a region that is distanced from a fin. This facilitates reduced process steps, allowing the gate and the source/drain regions to be opened in the same process step. Extreme Ultraviolet Lithography (EUVL) may be used to pattern the resist to form the contacts.

In a first aspect, embodiments of the present invention provide a semiconductor structure comprising: a semiconductor substrate; a plurality of semiconductor fins disposed on the semiconductor substrate; a shallow trench isolation between fins of the plurality of fins; a first gate disposed on the semiconductor substrate adjacent to at least one fin of the plurality of fins; a second gate disposed over a non-active area of the substrate; a first insulator region disposed between the first gate and the second gate, and in direct physical contact with the non-active area of the substrate; a metal layer disposed on, and in contact with, the at least one fin of the plurality of fins; a second insulator region disposed over the first insulator region and metal contact layer; a first contact via disposed in the second insulator layer and making contact with the contact metal layer; and a second contact via disposed in the second insulator layer and the second insulator layer, and making contact with the second gate.

In a second aspect, embodiments of the present invention provide a method of forming a semiconductor structure, comprising: forming a plurality of fins on a semiconductor substrate; removing a portion of at least one fin of the plurality of fins; depositing a shallow trench isolation between fins of the plurality of fins; forming a plurality of gates on the semiconductor substrate, oriented perpendicular to, and disposed over, the plurality of fins such that a first gate of the plurality of gates is adjacent to the at least one fin, and a second gate of the plurality of gates is distanced from the at least one fin and disposed over the shallow trench isolation; depositing a capping layer over the substrate, the first gate, and the second gate to form a cap over the first gate and the second gate; depositing a sacrificial layer on the capping layer; removing a portion of the sacrificial layer; removing the capping layer from the second gate and area of substrate disposed between the first gate and the second gate; depositing a first insulator layer on the capping layer, the substrate, and the second gate; removing the sacrificial layer to expose the fin; depositing a metal layer over the fin; depositing a second insulator layer over the metal layer and the first insulator layer; forming a first cavity in the second insulator layer and the first insulator layer to expose the second gate; forming a second cavity in the second insulator layer to expose the metal layer; and filling the first cavity and second cavity with a conductive material.

In a third aspect, embodiments of the present invention provide a method of forming a semiconductor structure, comprising: forming a plurality of fins on a semiconductor substrate; removing a portion of at least one fin of the plurality of fins; depositing a shallow trench isolation between fins of the plurality of fins; forming a plurality of gates on the semiconductor substrate, oriented perpendicular to, and disposed over, the plurality of fins, such that a first gate of the plurality of gates is adjacent to the at least one fin, and a second gate of the plurality of gates is distanced from the at least one fin and disposed over a non-active area portion of the substrate; depositing a capping layer over the substrate, the first gate, and the second gate; depositing a sacrificial layer on the capping layer; removing a portion of the sacrificial layer between the first gate and the second gate; removing the capping layer from the second gate and an area of the substrate disposed between the first gate and the second gate; depositing a first insulator layer on the second gate, and the area of the substrate disposed between the first gate the second gate; removing the sacrificial layer; removing the capping layer to expose the fin; depositing a metal layer over the fin; depositing a second insulator layer over the metal layer and second insulator layer; depositing a resist layer over the second insulator layer; simultaneously forming a plurality of cavities in the resist layer using an Extreme Ultraviolet Lithography process; extending the plurality of cavities through at least one of the second insulator layer and the first insulator layer; and filling the plurality of cavities with a conductive material.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof. The term "include" shall have the same meaning as "comprise" when used herein.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in some embodiments," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second layer, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 1:
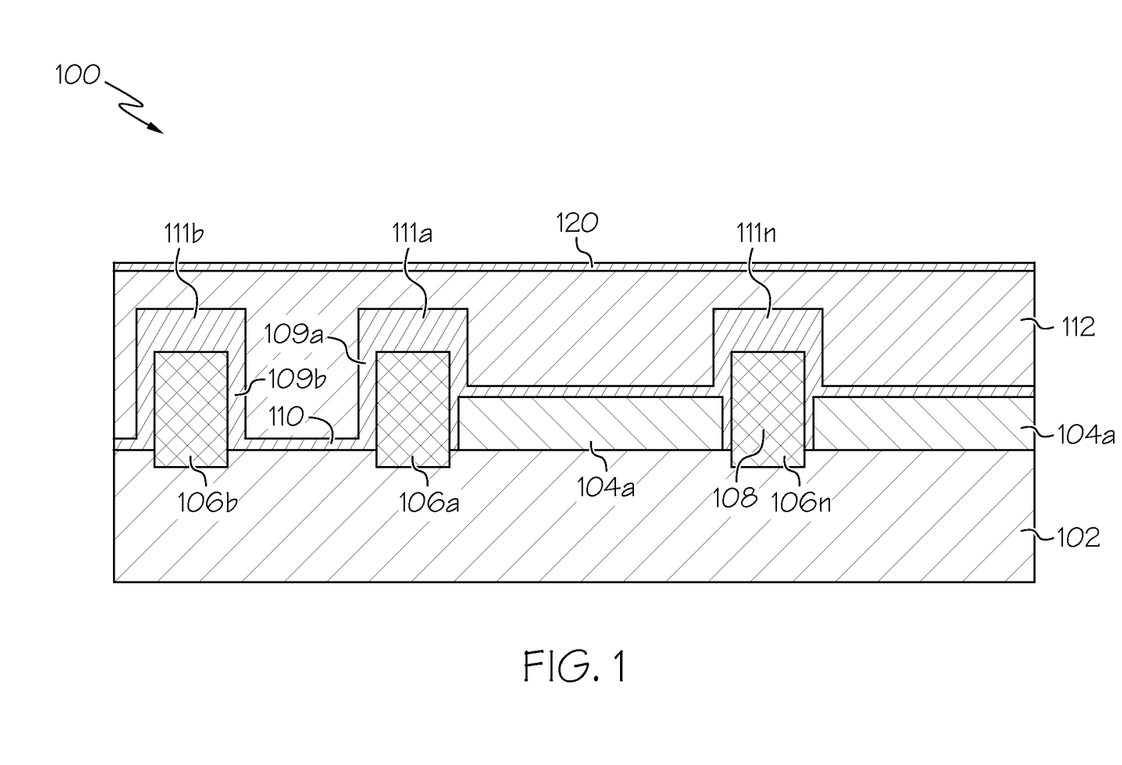
FIG. 1 is a semiconductor structure at a starting point for embodiments of the present invention.

FIG. 1 is a semiconductor structure 100 at a starting point for embodiments of the present invention. Semiconductor structure 100 includes a semiconductor substrate 102. The term "substrate" as used herein is intended to include a semiconductor substrate, a semiconductor epitaxial layer deposited or otherwise formed on a semiconductor substrate, and/or any other suitable type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. The semiconductor substrate may be doped, undoped, or contain doped regions and undoped regions therein. The semiconductor substrate may contain regions with strain and regions without strain therein, or contain regions of tensile strain and compressive strain.

Figure 2A:
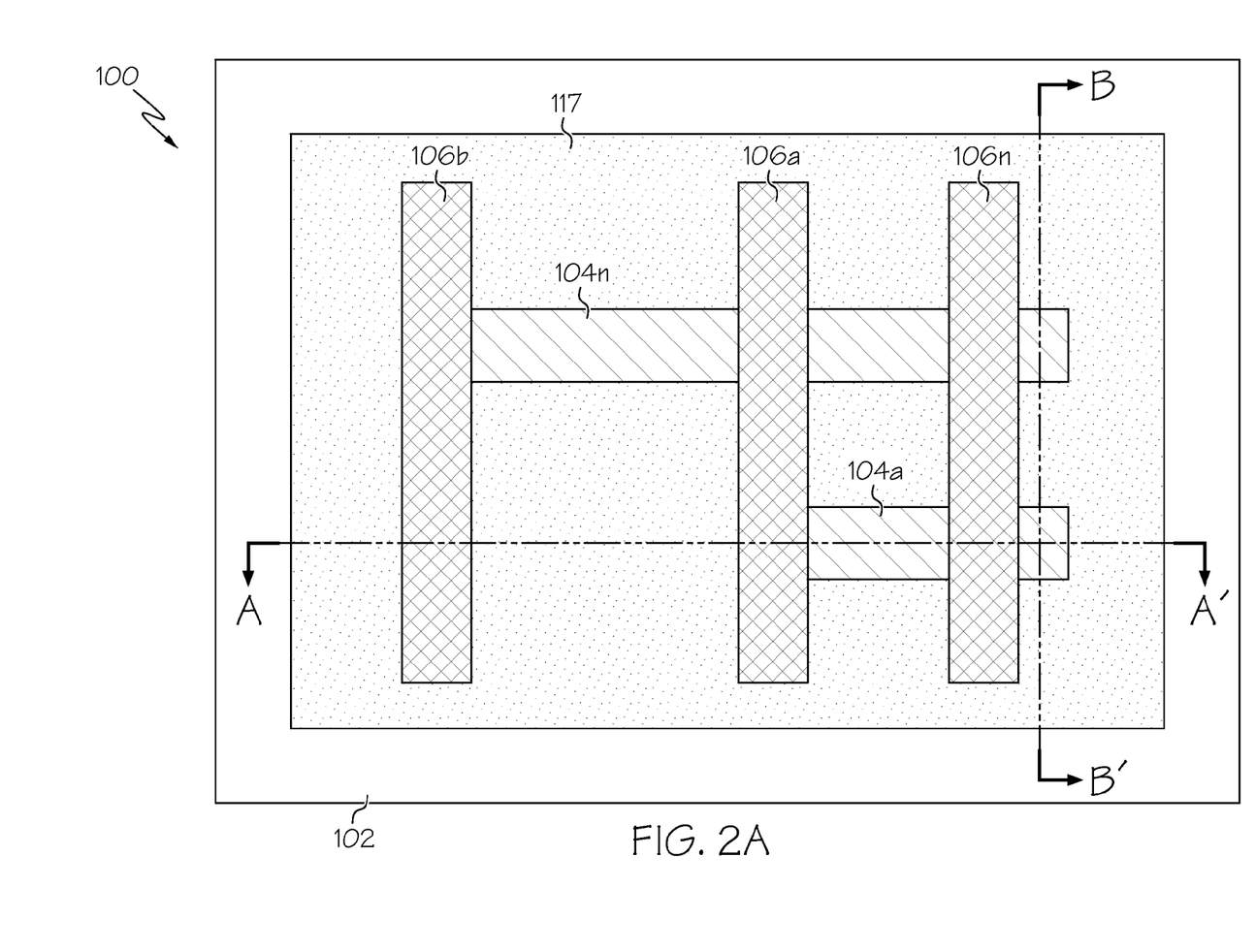
FIG. 2A is a top-down view of a semiconductor structure in accordance with embodiments of the present invention.

A plurality of semiconductor fins, such as 104a (and 104n as shown on FIG. 2), are formed on the semiconductor substrate 102. Although not specifically shown, it will be appreciated that fins 104a-104n are patterned to the configuration shown, for instance, using a photo-lithography process or other lithographic process (e.g., electron beam lithography, imprint lithography, EUV lithography, etc.), and removed by a suitable etching process including a wet etch, dry etch, plasma etch, and the like. The fins are initially formed as very long parallel lines, followed by cutting out portions of those fins so as to generate a desired pattern of active semiconductor areas.

A plurality of gates, such as gates 106a, 106b, and, in some embodiments, 106n are formed on the semiconductor substrate 102, oriented perpendicular to, and disposed over, the plurality of fins 104a-104n. Although not specifically shown, it will be appreciated that gates 106a-106n are formed by industry-standard techniques, and may include a replacement metal gate (RMG) process. The metal gates at the conclusion of the RMG process, are partially recessed and a dielectric cap is deposited into the recess. The dielectric cap may be, for example, silicon nitride. Gate caps 111a and 111b are formed on top of the gates 106a and 106b, respectively. Gate spacers 109a are formed adjacent to gates 106a. Gate spacers 109b are formed adjacent to gate 106b. A first gate 106a of the plurality of gates is adjacent to the fin 104a or, in some embodiments, may be overlapping the end of the fin 104a, and a second gate 106b of the plurality of fins is distanced from the fin 104a. A contact etch stop layer (CESL) 110 is disposed over the substrate 102, first gate 106a, and second gate 106b. The CESL insures the integrity of the semiconductor in the source and drain area of the fin 104a, protecting it during subsequent etch processes. In some embodiments, the CESL 110 may cover more than those elements, such as third gate 106c. It covers active areas (formerly exposed fin top) and shallow trench isolation regions (117 in FIGS. 2A and 2B). In some embodiments, the capping layer 110 is silicon nitride or another suitable material. A sacrificial layer 112 is deposited on the capping layer 110. In some embodiments, the sacrificial layer 112 is silicon oxide (SiO2). A chemical mechanical polish (CMP) stop layer 120 is disposed over the sacrificial layer 112. In some embodiments, the CMP stop layer 120 comprises nitride, such as silicon nitride, or another suitable material.

Figure 2B:
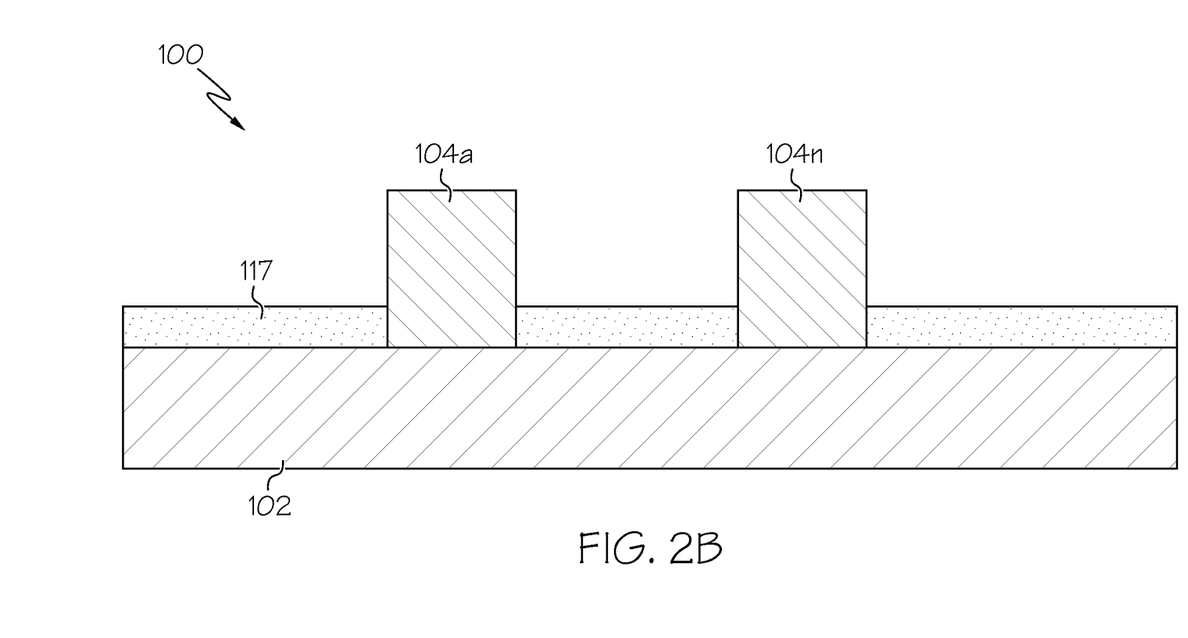
FIG. 2B is a side view of a semiconductor structure in accordance with embodiments of the present invention.

FIG. 2A is a top-down view of a semiconductor structure 100 indicating the orientation of the gate and fins (note that, for clarity, the overlying layers shown in FIG. 1 are not shown in this view). Semiconductor structure 100 is shown having gates 106a, 106b, and 106n and fins 104a and 104n. Shallow trench isolation (STI) region 117 is disposed on the substrate. The STI region 117 (also referred to herein as isolation area or dielectric) is disposed between the fins and may be formed by depositing a dielectric material (e.g., a silicon oxide), over the substrate 102, planarizing it, and then recessing the STI region so that an upper portion of the fins is exposed, effectively isolating active areas from one another. FIG. 2B is a side view along line B-B' of FIG. 2A, indicating the positioning of STI region 117 disposed on the substrate 102 and in between fins 104a and 104n. All subsequent views herein are cross sections along cut line A-A'.

Figure 3:
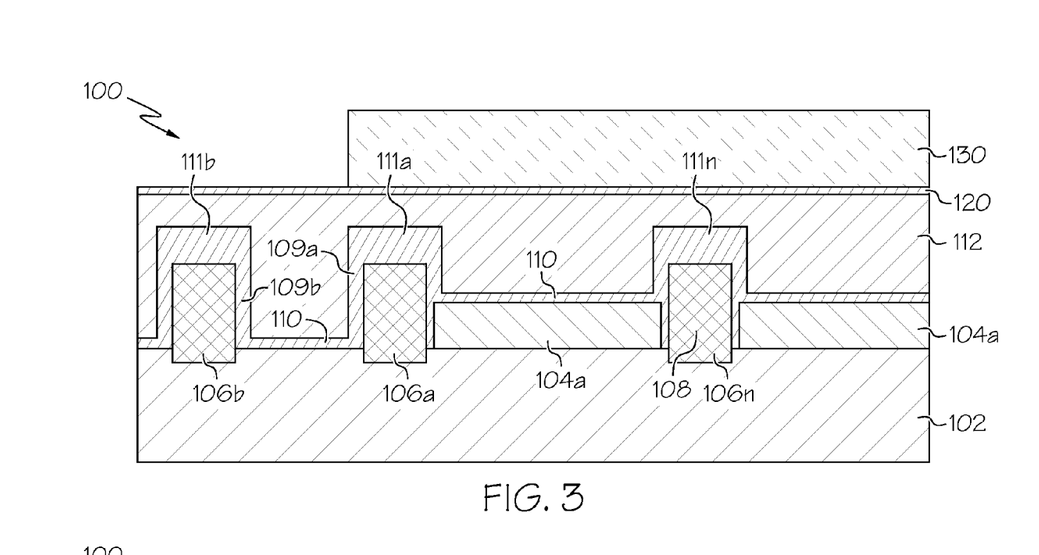
FIG. 3 is a semiconductor structure after a subsequent process step of depositing a resist layer.

FIG. 3 is a semiconductor structure 100 after a subsequent process step of depositing a resist layer. Resist layer is shown at 130. In some embodiments, resist layer 130 comprises poly isoprene, poly methyl methacrylate, or other suitable material. In other embodiments, the resist layer 130 may be comprised of a stack, for example, of Organic Planarization Layer (OPL), an antireflective coating, and/or a photoresist. In yet another embodiment, the lithography stack 130 may comprise an amorphous silicon or spin on hardmask (SOH) type of layer, and a memorization layer over it (e.g., silicon oxide, silicon nitride or a silicon oxynitride) and under the photoresist allowing for multi-patterning.

Figure 4:
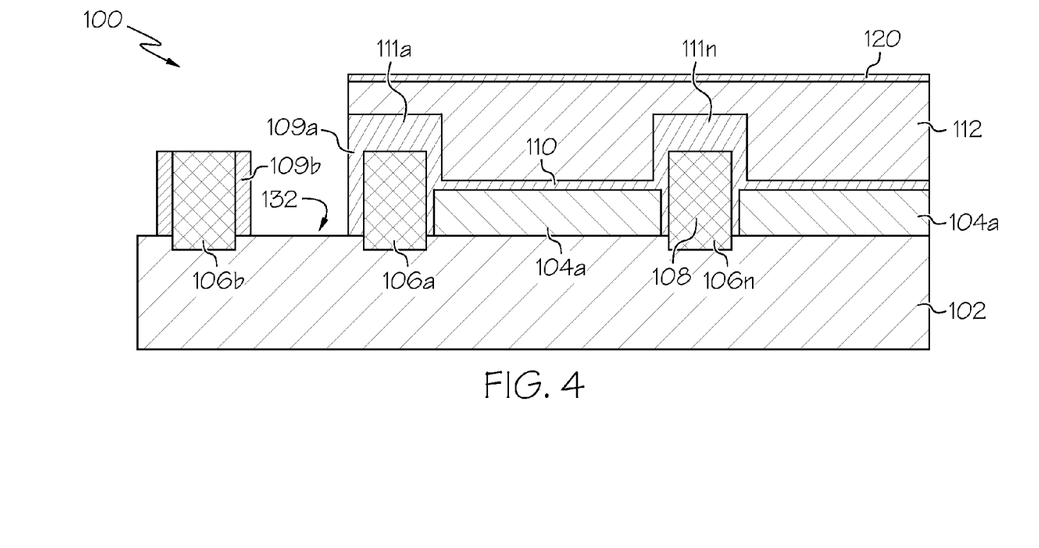
FIG. 4 is a semiconductor structure after a subsequent process step of shaping dummy contact areas within a scheme of Replacement Metal Contact (RMC)

FIG. 4 is a semiconductor structure 100 after a subsequent process step of shaping dummy contact areas within a scheme of Replacement Metal Contact (RMC) akin for contacts to the well-known RMG scheme for gates. This process results in exposing a gate 106b, while gates 106a and 106n located over fins are still buried under sacrificial layer 112. This is achieved by removing a portion of the sacrificial layer 112 between the first gate 106a and the second gate 106b, using typically a reactive ion etch process (RIE). This same etch process results also in removing the gate cap 111B from over the gate 106b. The CESL 110 can also be partially or entirely removed from over the exposed section of the substrate shown generally by reference number 132. The sacrificial layer 112 is completely removed from over gate 106b. Thereafter, second gate 106b and area 132 of substrate 102 are exposed. Since area 132 is a non-active area (not an active fin area), removal of the sacrificial layer here does not present any adverse effects.

Figure 5:
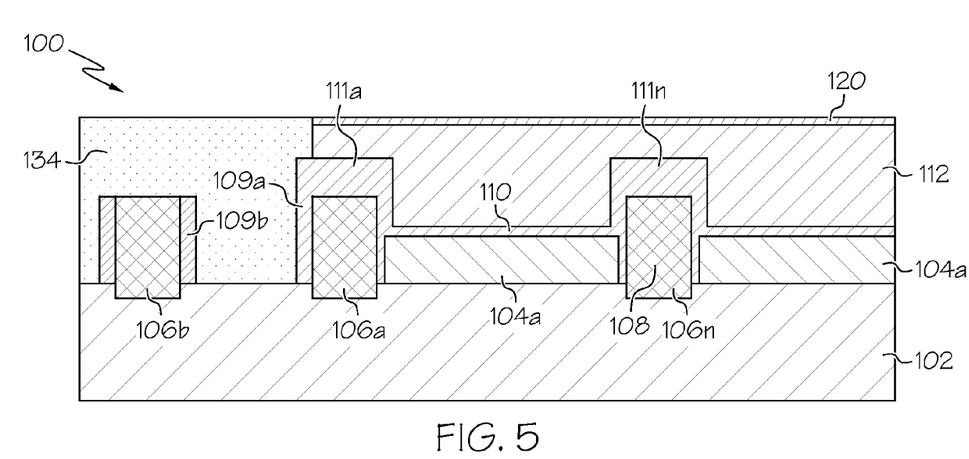
FIG. 5 is a semiconductor structure after a subsequent process step of depositing a first insulator layer.

FIG. 5 is a semiconductor structure 100 after a subsequent process step of depositing a first insulator layer 134. A first insulator layer 134 is deposited over capping layer 120 and exposed area 132 (see FIG. 4) of substrate 102. In some embodiments, first insulator 134 comprises silicon oxycarbide (SiOC). A chemical-mechanical planarization (CMP) process is then performed resulting in the cross-section shown in FIG. 5. Capping layer 120 acts as a CMP stop-layer for end-point detection.

Figure 6:
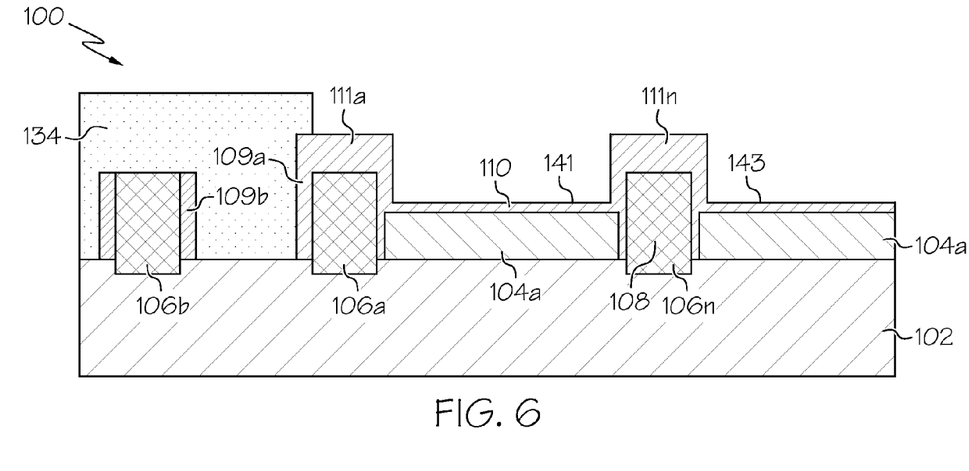
FIG. 6 is a semiconductor structure after a subsequent process step of removing a sacrificial layer.

FIG. 6 is a semiconductor structure after a subsequent process step of removing the sacrificial layer 112, acting so far as a dummy contact placeholder. First, capping layer 120 is removed, for instance by means of a selective nitride RIE process, or using a wet etch with hot phosphoric acid. The sacrificial layer 112 is then removed, in some embodiments, via diluted hydrofluoric acid wet etch or other suitable process. First insulator 134 is impervious to diluted hydrofluoric acid. For instance, SiOC, due to the carbon content in the dielectric, can sustain long exposure to diluted hydrofluoric acid wet etch without erosion, while sacrificial SiO2 is etched away. Silicon nitride also is not etched. The resulting structure is one where the source area 141 and drain area 143 of the fin 104a are now exposed except for the CESL layer 110, while the non-active area 132 (see FIG. 4) may be buried under layer 134.

Figure 7:
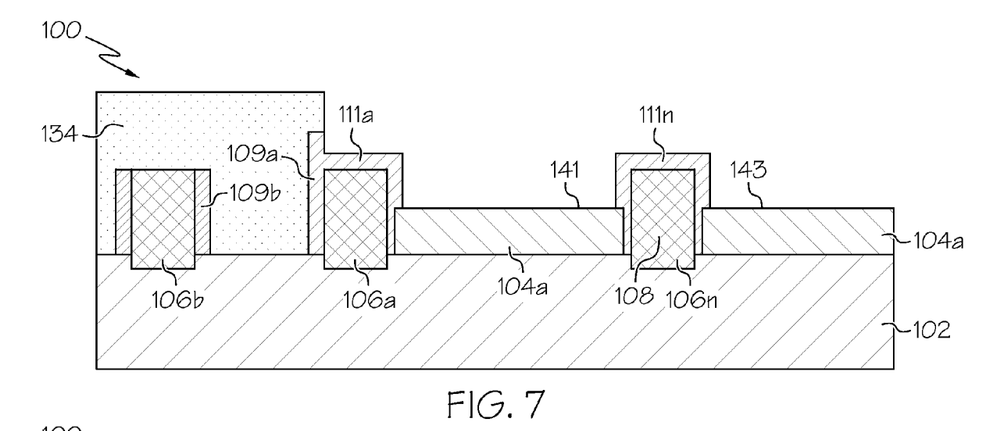
FIG. 7 is a semiconductor structure after a subsequent process step of removing a portion of the CESL to expose the source area and drain area.

FIG. 7 is a semiconductor structure 100 after a subsequent process step of removing a portion of the CESL to expose the source area 141 and drain area 143 in view of establishing electrical contact to the active fin areas. A portion of the CESL 110 is removed, exposing fin 104a. In some embodiments, the removal is achieved by a selective anisotropic etch, such as a reactive ion etch (RIE), or other suitable process. A consequence of this step is also to thin down the protective gate cap 111a over gate 106a, and in some embodiments, gate cap 111n over gate 106n. Yet sufficient nitride remains to insure, in subsequent steps, isolation to the top of the gates 106a and 106n.

Figure 8:
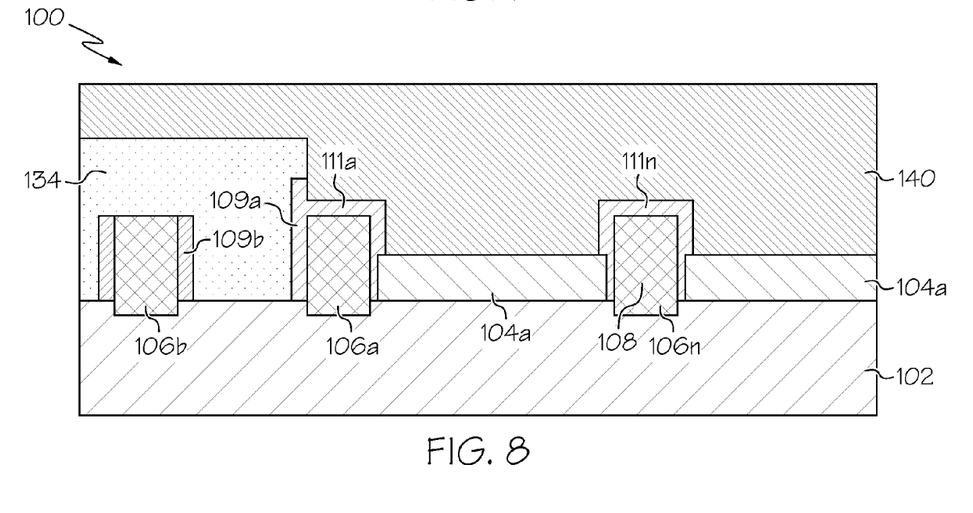
FIG. 8 is a semiconductor structure after a subsequent process step of depositing a contact metal layer.

FIG. 8 is a semiconductor structure 100 after a subsequent process step of depositing a contact metal layer. The contact metal layer is deposited over fins 104a-104n and first insulator 134. In some embodiments, a thin liner made of Ti and TiN (not shown) is deposited to receive the contact metal layer 140. In some embodiments, the contact metal layer 140 is, for example, tungsten or cobalt.

Figure 9:
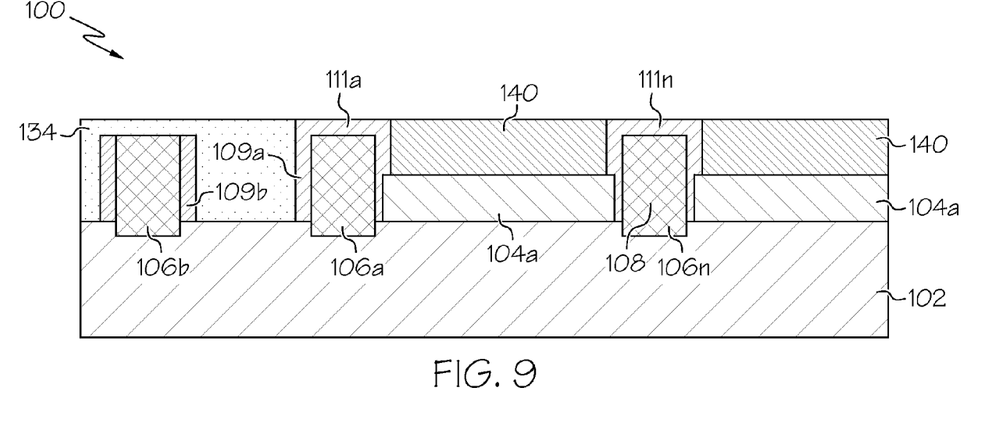
FIG. 9 is a semiconductor structure after a subsequent process step of planarizing the semiconductor structure.

FIG. 9 is a semiconductor structure 100 after a subsequent process step of planarizing the semiconductor structure. Semiconductor structure 100 is planarized to create a substantially level surface including the first insulator 134, gate cap 111a, and fill contact metal 140. In some embodiments, the planarization is achieved by a chemical mechanical polish process or other suitable process. This completes the Replacement Contact Scheme, as the dummy placeholder contacts patterned over the fins have now been replaced by metal.

Figure 10:
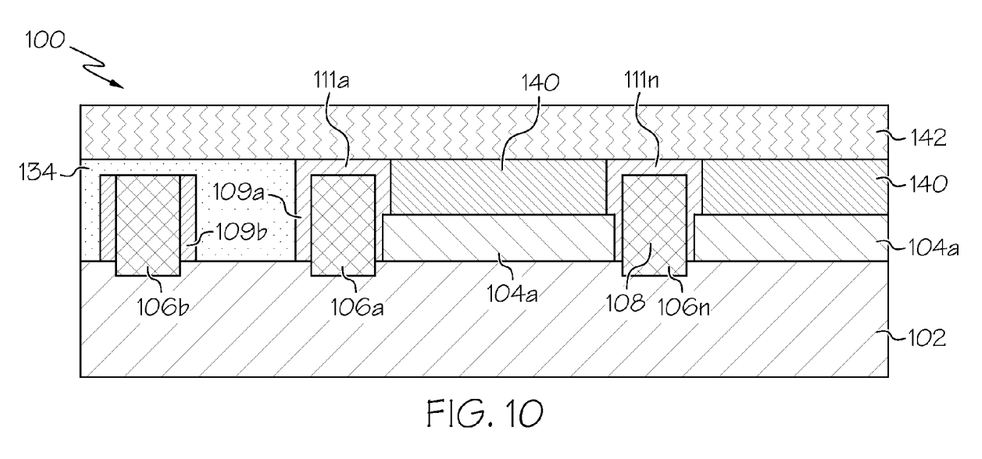
FIG. 10 is a semiconductor structure after a subsequent process step of depositing a second insulator region.

FIG. 10 is a semiconductor structure 100 after a subsequent process step of depositing a second insulator region, often referred to as inter layer dielectric (ILD). A second insulator region 142 is disposed over the metal layer 140 and the first insulator layer 134. In some embodiments, second insulator 142 comprises, for example, silicon oxide (SiO2).

Figure 11:
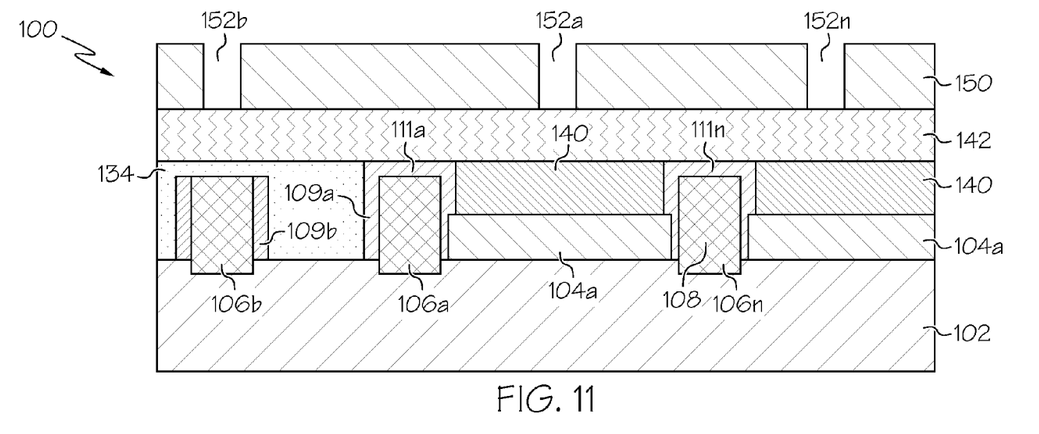
FIG. 11 is a semiconductor structure after subsequent process steps of depositing and patterning a resist layer.

FIG. 11 is a semiconductor structure 100 after subsequent process steps of depositing and patterning a resist layer. A resist layer 150 is deposited over second insulator layer 142. In some embodiments, the resist layer 150 comprises a stack of layers, such as an OPL, an antireflective coating, and/or a photosensitive resist. The resist layer 150 is patterned to form a plurality of cavities (e.g., cavities 152a, 152b, and 152n). In embodiments, the cavities may be formed simultaneously. In some embodiments, more or fewer than three cavities may be formed. In some embodiments, the patterning to create the plurality of cavities 152a-152n is achieved in the resist layer 150 using an Extreme Ultraviolet Lithography (EUV) process. In embodiments, the light used in EUV Lithography has a wavelength of less than 20 nm. This short wavelength facilitates increased resolution in patterning, and in some cases, can eliminate the need for multiple patterning steps.

Figure 12:
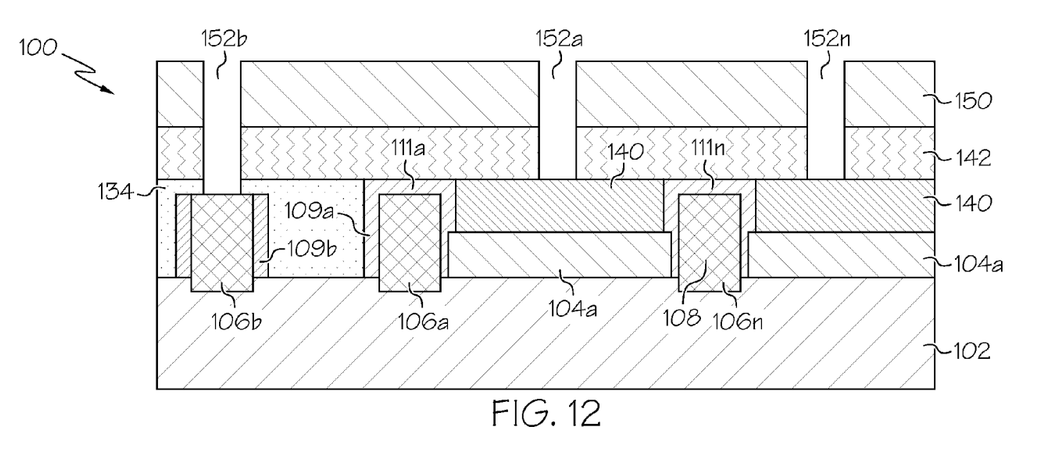
FIG. 12 is a semiconductor structure after performing a contact cavity etch.

FIG. 12 is a semiconductor structure 100 after performing a contact cavity etch. In some embodiments, the cavities 152a and 152b are extended through the second insulator layer 142. In some embodiments, other cavities, such as cavity 152n, are extended as well. In some embodiments, the extension is achieved via an etch, such as a reactive ion etch or other suitable process. Extension of the first cavity 152a exposes the second gate 106b, and extension of the second cavity 152b exposes the metal layer 140. Thus, this step allows the gate 106b and the source/drain regions (metal region 140 above fin 104a) to be opened in the same process step, which saves fabrication time and costs. This was made possible by virtue of the step described in FIG. 4, removing the cap 111b from over gate 106b.

Figure 13:
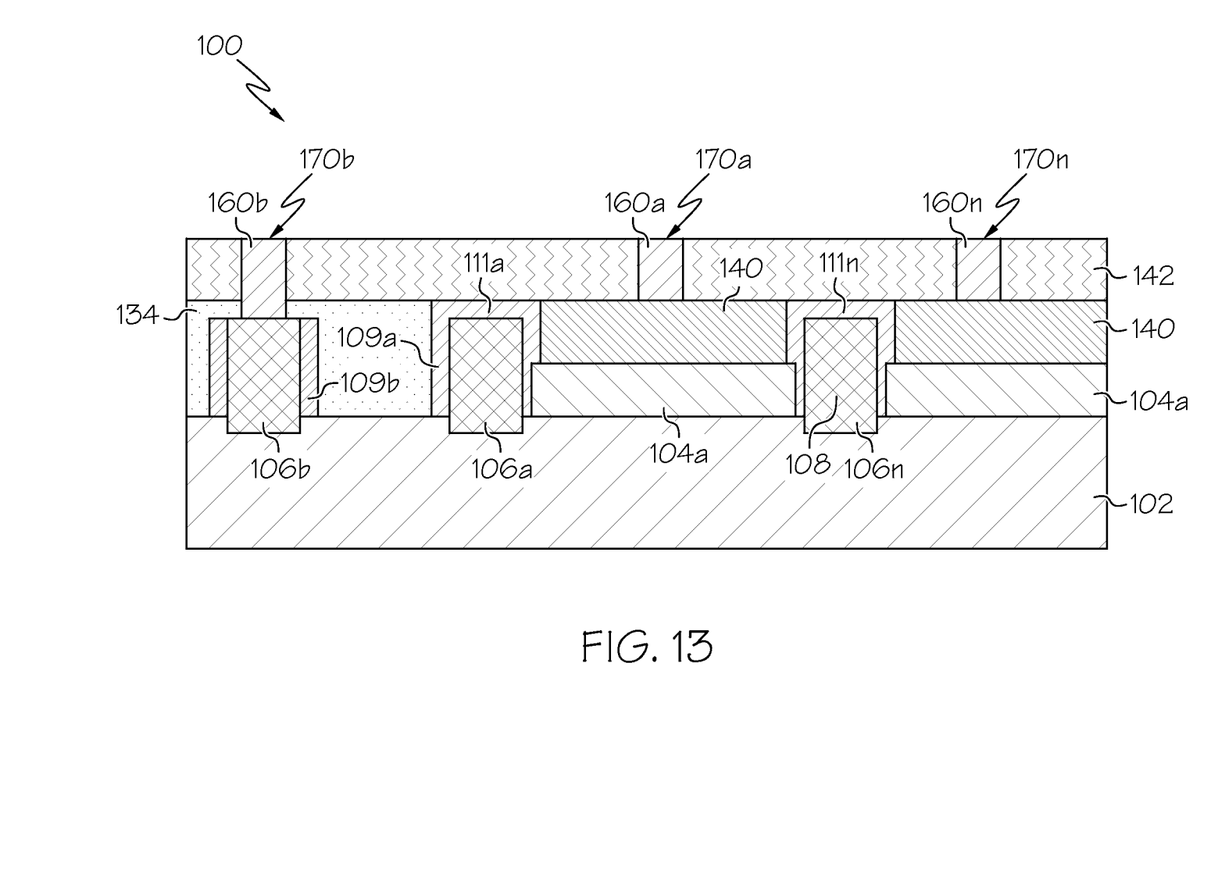
FIG. 13 is a semiconductor structure after filling the contact cavities with a conductive material.

FIG. 13 is a semiconductor structure 100 after filling the contact cavities with a conductive material. Resist layer 150 is removed, and cavities 152a and 152b, and, in some embodiments, 152n, are filled with conductive material 160a-160n to become contacts or vias 170a-170n. In some embodiments, the filling is achieved by first depositing a liner (not shown) acting as an adhesion and barrier layer. In some embodiments, the filling is achieved using a chemical vapor deposition (CVD) process. In some embodiments, conductive material 160a-160n may include tungsten, cobalt, copper, aluminum, and/or another suitable conductor.

The illustration of FIG. 13 shows a semiconductor structure 100 in accordance with embodiments of the present invention. The semiconductor structure 100 includes a substrate 102; a semiconductor fin 104a disposed on the substrate 102; a first gate 106a disposed on the substrate 102 adjacent to or over the fin 104a; a second gate 106b disposed on the substrate 102; a first insulator region 134 disposed between the first gate 106a and the second gate 106b, and in direct physical contact with the substrate 102; a metal layer 140 disposed on the fin 104a; a second insulator region 142 disposed over the first insulator region 134 and metal layer 140; a first contact via 170a (and third contact via 170n) disposed in the second insulator layer 142 and making contact with the metal layer 140; and a second contact via 170b disposed in the first insulator layer 134 and making contact with the second gate 106b. In some embodiments, the semiconductor structure 100 also includes a capping layer 111a over the first gate 106a, but not over the second gate 106b.

Figure 14:
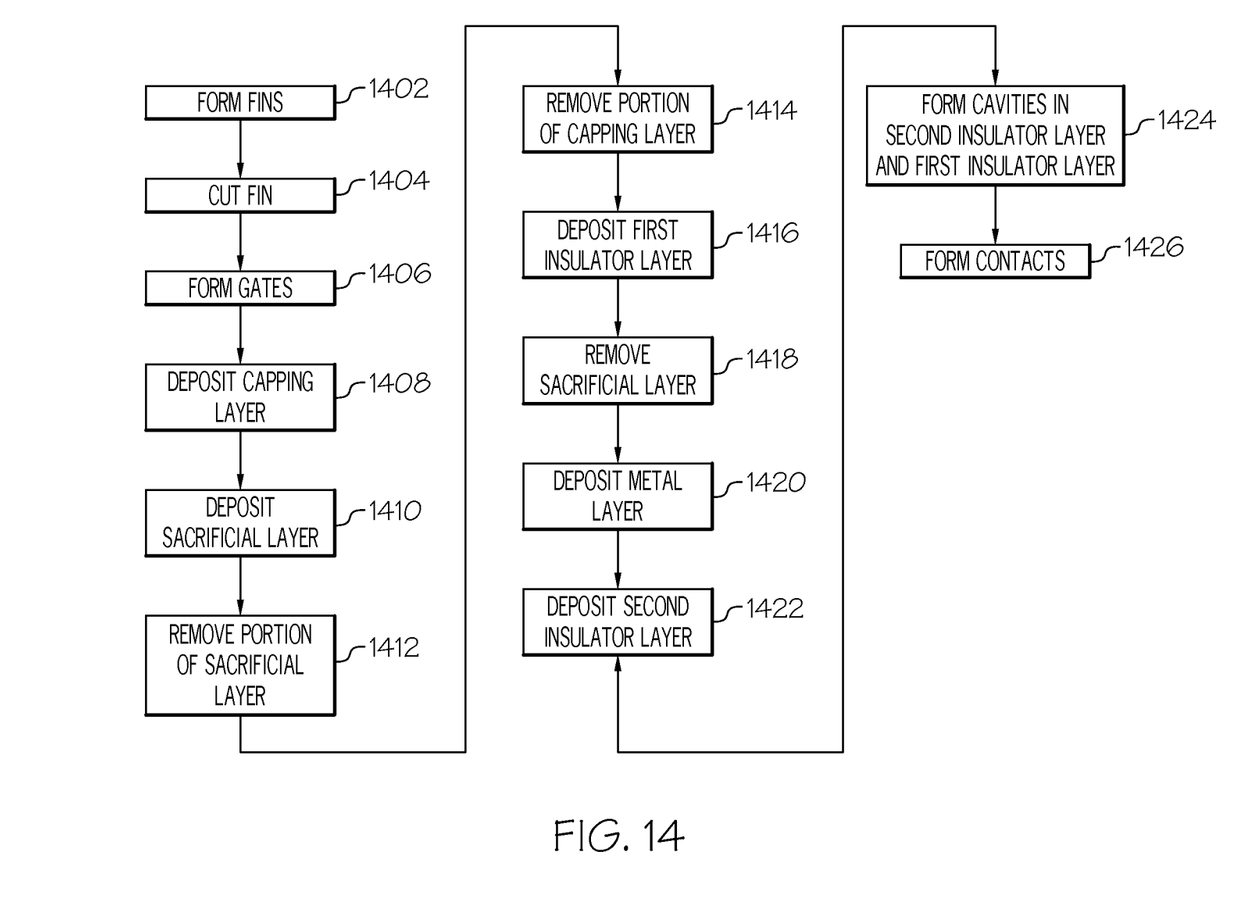
FIG. 14 is a flowchart indicating process steps for embodiments of the present invention.

FIG. 14 is a flowchart indicating process steps for embodiments of the present invention. At 1402, a plurality of fins are formed on a semiconductor substrate. At 1404, a portion of a fin of the plurality of fins is removed (cut) and the non-active area processed to isolate active islands formed by the tips of the fins. At 1406, a plurality of gates are formed on the semiconductor substrate, oriented perpendicular to, and disposed over, the plurality of fins, such that a first gate of the plurality of gates is adjacent to the fin, and a second gate of the plurality of gates is distanced from the fin and located over a non-active area. At 1408, a capping layer is deposited over the substrate, the first gate, and the second gate. At 1410, a sacrificial layer is deposited on the capping layer. At 1412, a portion of the sacrificial layer is removed. At 1414, a portion of the capping layer is removed from the second gate and area of substrate disposed between the first gate and the second gate. At 1416, a first insulator layer is deposited on the capping layer, the substrate, and the second gate. At 1418, the sacrificial layer and capping layer are removed to expose the fin. At 1420, a metal layer is deposited over the fin. At 1422, a second insulator layer is deposited over the metal layer and the first insulator layer. At 1424, a first cavity is formed in the second insulator layer and the first insulator layer to expose the second gate, and a second cavity is formed in the second insulator layer to expose the metal layer. At 1426, the first cavity and second cavity are filled with a conductive material to form via contacts.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
   a semiconductor substrate;
   a plurality of semiconductor fins disposed on the semiconductor substrate;
   a shallow trench isolation between fins of the plurality of fins;
   a first gate disposed on the semiconductor substrate adjacent to at least one fin of the plurality of fins;
   a second gate disposed over a non-active area of the substrate;
   a first insulator layer disposed between the first gate and the second gate, and in direct physical contact with the non-active area of the substrate;
   a metal layer disposed on, and in contact with, the at least one fin of the plurality of fins;
   a second insulator layer disposed over the first insulator layer and metal contact layer;
   a first contact via disposed in the second insulator layer and making contact with the contact metal layer; and
   a second contact via disposed in the second insulator layer and the first insulator layer, and making contact with the second gate.

2. The semiconductor structure of claim 1, wherein the first insulator layer is comprised of silicon oxycarbide.

3. The semiconductor structure of claim 2, wherein the second insulator layer is comprised of silicon oxide.

4. The semiconductor structure of claim 3, further comprising a capping layer disposed over the first gate.

5. The semiconductor structure of claim 4, wherein the capping layer is comprised of silicon nitride.

6. The semiconductor structure of claim 1, wherein the first contact and second contact vias are comprised of tungsten.

7. A method of forming a semiconductor structure, comprising:
   forming a plurality of fins on a semiconductor substrate;
   removing a portion of at least one fin of the plurality of fins;
   depositing a shallow trench isolation between fins of the plurality of fins;
   forming a plurality of gates on the semiconductor substrate, oriented perpendicular to, and disposed over, the plurality of fins such that a first gate of the plurality of gates is adjacent to the at least one fin, and a second gate of the plurality of gates is distanced from the at least one fin and disposed over the shallow trench isolation;
   depositing a capping layer over the substrate, the first gate, and the second gate to form a cap over the first gate and the second gate;

depositing a sacrificial layer on the capping layer;
removing a portion of the sacrificial layer;
removing the capping layer from the second gate and area of substrate disposed between the first gate and the second gate;
depositing a first insulator layer on the capping layer, the substrate, and the second gate;
removing the sacrificial layer to expose the fin;
depositing a metal layer over the fin;
depositing a second insulator layer over the metal layer and the first insulator layer;
forming a first cavity in the second insulator layer and the first insulator layer to expose the second gate;
forming a second cavity in the second insulator layer to expose the metal layer; and
filling the first cavity and second cavity with a conductive material.

8. The method of claim 7, wherein depositing a capping layer comprises depositing silicon nitride.

9. The method of claim 7, wherein depositing a sacrificial layer comprises depositing silicon oxide.

10. The method of claim 9, wherein depositing a first insulator layer comprises depositing silicon oxide.

11. The method of claim 10, wherein depositing the second insulator layer comprises depositing silicon oxycarbide.

12. The method of claim 10, wherein removing the sacrificial layer to expose the fin is performed with a hydrofluoric acid wet etch.

13. The method of claim 10, wherein forming a first cavity in the second insulator layer is performed using a reactive ion etch process.

14. A method of forming a semiconductor structure, comprising:
  forming a plurality of fins on a semiconductor substrate;
  removing a portion of at least one fin of the plurality of fins;
  depositing a shallow trench isolation between fins of the plurality of fins;
  forming a plurality of gates on the semiconductor substrate, oriented perpendicular to, and disposed over, the plurality of fins, such that a first gate of the plurality of gates is adjacent to the at least one fin, and a second gate of the plurality of gates is distanced from the at least one fin and disposed over a non-active area portion of the substrate;
  depositing a capping layer over the substrate, the first gate, and the second gate;
  depositing a sacrificial layer on the capping layer;
  removing a portion of the sacrificial layer between the first gate and the second gate;
  removing the capping layer from the second gate and an area of the substrate disposed between the first gate and the second gate;
  depositing a first insulator layer on the second gate, and the area of the substrate disposed between the first gate the second gate;
  removing the sacrificial layer;
  removing the capping layer to expose the fin;
  depositing a metal layer over the fin;
  depositing a second insulator layer over the metal layer and first insulator layer;
  depositing a resist layer over the second insulator layer;
  simultaneously forming a plurality of cavities in the resist layer using an Extreme Ultraviolet Lithography process;
  extending the plurality of cavities through at least one of the second insulator layer and the first insulator layer; and
  filling the plurality of cavities with a conductive material.

15. The method of claim 14, wherein depositing the capping layer comprises depositing silicon nitride.

16. The method of claim 14, wherein depositing the sacrificial layer comprises depositing silicon oxide.

17. The method of claim 16, wherein depositing the first insulator layer comprises depositing silicon oxycarbide.

18. The method of claim 16, wherein removing the sacrificial layer is performed with a hydrofluoric acid wet etch.

19. The method of claim 14, wherein filling the plurality of cavities with a conductive material comprises filling the plurality of cavities with tungsten.

20. The method of claim 14, wherein extending the plurality of cavities through the second insulator layer and first insulator layer is performed using a reactive ion etch process.

* * * * *